(12) United States Patent
Corredoura et al.

(10) Patent No.: US 7,450,659 B2
(45) Date of Patent: Nov. 11, 2008

(54) DIGITAL MODULATOR EMPLOYING A POLYPHASE UP-CONVERTER STRUCTURE

(75) Inventors: Paul L. Corredoura, Redwood City, CA (US); Vamsi K. Srikantam, Sunnyvale, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 696 days.

(21) Appl. No.: 10/814,472

(22) Filed: Mar. 29, 2004

(65) Prior Publication Data

US 2005/0213683 A1   Sep. 29, 2005

(51) Int. Cl.
H04L 27/00 (2006.01)
(52) U.S. Cl. ...................... 375/295; 375/350
(58) Field of Classification Search .................. 375/295, 375/349, 331, 332, 350, 260; 370/208, 210; 455/303, 307, 337
See application file for complete search history.

(56) References Cited

U.S. PATENT DOCUMENTS

| | | | | |
|---|---|---|---|---|
| 4,393,456 | A * | 7/1983 | Marshall, Jr. | 708/316 |
| 5,917,735 | A * | 6/1999 | Ko | 708/313 |
| 6,085,077 | A * | 7/2000 | Fields et al. | 455/303 |
| 7,023,324 | B2 * | 4/2006 | Kodama et al. | 375/260 |
| 2003/0016772 | A1 * | 1/2003 | Ekstrand | 375/350 |
| 2003/0072284 | A1 * | 4/2003 | Webster et al. | 370/316 |
| 2003/0076899 | A1 * | 4/2003 | Kumar et al. | 375/316 |
| 2003/0117201 | A1 * | 6/2003 | Wang | 327/254 |
| 2004/0056785 | A1 | 3/2004 | Webster et al. | |
| 2005/0175130 | A1 * | 8/2005 | Yang | 375/350 |
| 2007/0268076 | A1 * | 11/2007 | Gomez | 331/16 |
| 2007/0285154 | A1 * | 12/2007 | Darabi et al. | 327/551 |

OTHER PUBLICATIONS

Johan Sommarek, Jouko Vankka, Jaakko Ketola, Ilari Teikari and Kari Halonen—"A Digital Quadrature Modulator With On-Chip D/A Converter", European Solid-State Circuits, 2003, ESSCIRC '03, Conference on Sep. 16-18, 2003, Piscataway, NJ, USA, IEEE; pp. 85-88.

Basuki Endah Priyanto, Choi Look Law, Yong Liang Quan—"Design & Implementation Of All Digital I-Q Modulator And Demodulator For High Speed WLAN in FPGA"; 2003 IEEE Pacific Rim Conference on Communications, Computers And Signal Processing, Victoria, BC Canada, Aug. 28-30, 2003; IEEE Pacific Rim Conference and Communications, Computers And Signal Processing, NY; pp. 659-662.

European Search Report dated Aug. 4, 2005.

* cited by examiner

Primary Examiner—Emmanuel Bayard

(57) ABSTRACT

An upconverting circuit is disclosed. The upconverting circuit includes a polyphase component generator that provides $N_p$ polyphase components at each input polyphase cycle, wherein $N_p>2$ on each input polyphase cycle defined by a clock. A memory stores the polyphase components from at least one polyphase cycle prior to the current polyphase cycle. A plurality of filters process the polyphase components stored in the memory. Each filter processes a plurality of the polyphase components to generate a filtered polyphase component corresponding to that filter. A multiplexer outputs the filtered polyphase components in a predetermined order to generate a filtered output signal. In one embodiment, each filter utilizes the same functional relationship to generate the filtered polyphase components. In another embodiment, the memory is a shift register. The filters can be of arbitrary complexity.

6 Claims, 5 Drawing Sheets

DIGITAL MODULATOR EMPLOYING A POLYPHASE UP-CONVERTER STRUCTURE

FIELD OF THE INVENTION

The present invention relates to digital signal processing.

BACKGROUND OF THE INVENTION

One method for modulating an RF signal with a digital data stream utilizes a digital modulator that accepts the digital baseband inputs, typically in a real and imaginary format, and outputs a digital signal at an IF sample rate. The digital IF signal is then converted to an analog signal by a digital-to-analog converter (DAC). The analog IF signal is mixed with a local oscillator to generate a modulated RF carrier.

These modulators require some form of equalizer to compensate for the variation in gain with frequency. In general, the required equalization will not be symmetric about the IF carrier frequency. For example, one source of nonsymmetrical gain roll-off associated with a digital modulator is the sin(x)/x response of the DAC used to produce the IF waveform from the digital signal. In addition, the response of amplifiers, filters and mixers in the IF or the following RF chain may also have gain functions that require equalization. The equalization compensates for these post IF gain functions by distorting the IF signal such that the distortions in the IF signal cancel the distortions introduced by the post IF components, In prior art modulators, the equalization filter is placed either after the DAC, before the DAC, or before the digital modulator. If the filter is placed after the DAC, a complicated analog filter design that is not reprogrammable or adaptable to changes in the transmitter response is required.

In principle, the baseband data can be pre-emphasized to provide the required correction to the non-ideal frequency response of the channel. In such systems, the baseband data is distorted such that the combination of the introduced distortion and the distortions of the channel cancel each other. In this case, a simpler analog filter can be used after the DAC. However, since the required response is, in general, not symmetric about the IF carrier, a filter with complex coefficients or real-imaginary and imaginary-real cross terms is required. At frequencies near the Nyquist limit for the baseband signals, the correction filters that provide the desired response are not always achievable.

The third approach utilizes a digital filter between the digital modulator and the DAC. While this approach simplifies the filter design, it requires a digital filter that runs at the DAC sampling rate. At high IF frequencies, such filters are too expensive for many applications.

SUMMARY OF THE INVENTION

The present invention includes an upconverting circuit. The upconverting circuit includes a polyphase component generator that provides $N_p$ polyphase components at each input polyphase cycle, wherein $N_p>2$ on each input polyphase cycle defined by a clock. A memory stores the polyphase components from at least one polyphase cycle prior to the current polyphase cycle. A plurality of filters process the polyphase components stored in the memory. Each filter processes a plurality of the polyphase components to generate a filtered polyphase component corresponding to that filter. These filters can be linear or non-linear with either finite or infinite impulse response. A multiplexer outputs the filtered polyphase components in a predetermined order to generate a filtered output signal. In one embodiment, each filter utilizes the same functional relationship to generate the filtered polyphase components. In one embodiment, the memory is a shift register. The filters can be of arbitrary complexity. In one embodiment, the polyphase component generator receives one pair of digital signals in each polyphase cycle.

DETAILED DESCRIPTION OF THE PREFERRED EMBODIMENTS OF THE INVENTION

Figure 1:
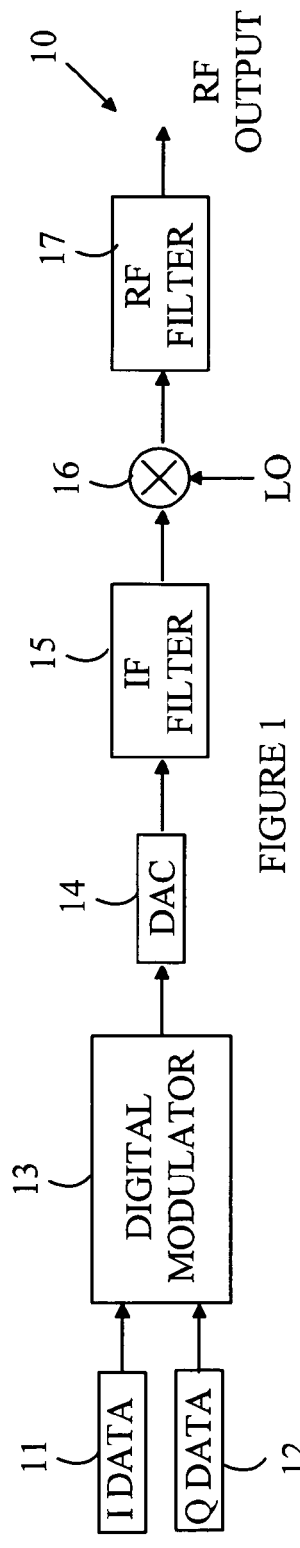
FIGS. 1-3 are block diagrams of prior art RF transmitter chains utilizing digital modulators.
Figure 2:
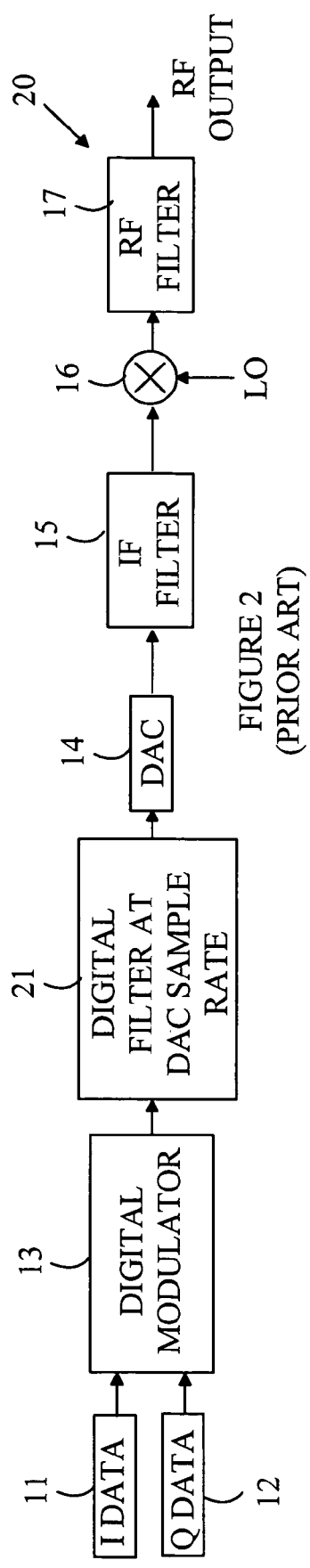
Figure 3:
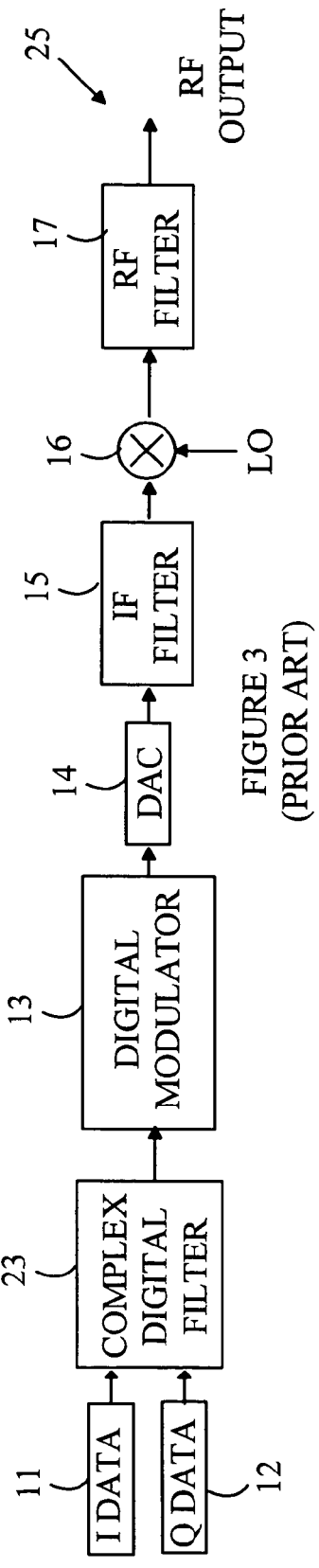

The manner in which the present invention provides its advantages can be more easily understood with reference to FIGS. 1-3, which are block diagrams of prior art RF transmitter chains utilizing digital modulators. Referring to FIG. 1, RF chain 10 receives real and imaginary digital data streams shown at 11 and 12. A digital modulator 13 upconverts these data streams to provide a digital IF data stream that is converted to an analog signal by DAC 14. The output of DAC 14 is filtered through an IF filter 15 prior to being mixed with a local oscillator in mixer 16 to generate an RF signal that is filtered by RF filter 17 to provide the RF output. As noted above, one method for correcting for the non-constant gain is to utilize a complex IF filter 15 that is tailored to the specific components in the IF chain.

A second method for compensating for these non-ideal response functions is to utilize a digital filter 21 between digital modulator 13 and DAC 14 as shown in RF chain 20. Since the digital filter is programmable, the problems associated with the custom analog filter discussed above are overcome. However, digital filter 21 must operate at the DAC sampling rate. At high frequencies, such digital filters can be expensive, and difficult or even impractical to realize.

The third prior art method for compensating for the non-ideal response function is to distort the input data to the digital modulator with a complex filter 23, as shown in RF chain 25, such that the combination of the distortions introduced by filter 23 and the distortions introduced by the remainder of the modulation chain cancel each other. As noted above, such filters are difficult to realize in many applications of interest.

Figure 4:
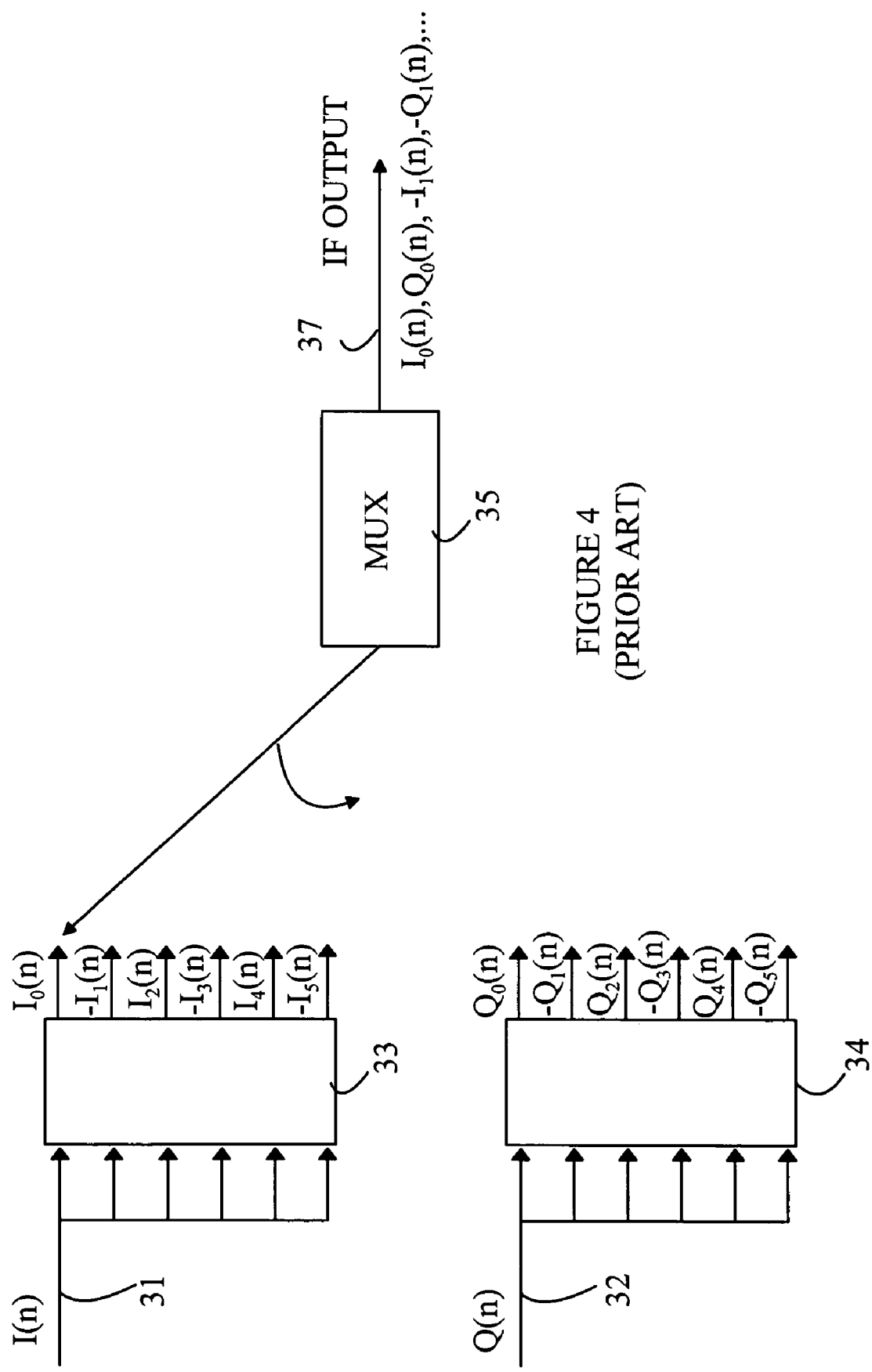
FIG. 4 illustrates a digital modulator based on a polyphase filter up-converter.

The present invention overcomes the problems associated with the prior art digital design shown in FIG. 2 by incorporating the filter function in the digital modulator. Refer now to FIG. 4, which illustrates a digital modulator based on a polyphase filter up-converter which produces an IF output at ¼ of the output sample rate. The I and Q data streams shown at 31 and 32 are processed by polyphase filters 33 and 34 to provide the polyphase components $I_k(n)$ and $Q_k(n)$. The signs of the odd indexed components are changed to produce the desired IF frequency, and the polyphase components are then combined by a high speed multiplexer 35 to form the IF output 37. It is also possible to replace the sign changes with a group of complex rotators to produce programmable IF frequencies.

Figure 5:
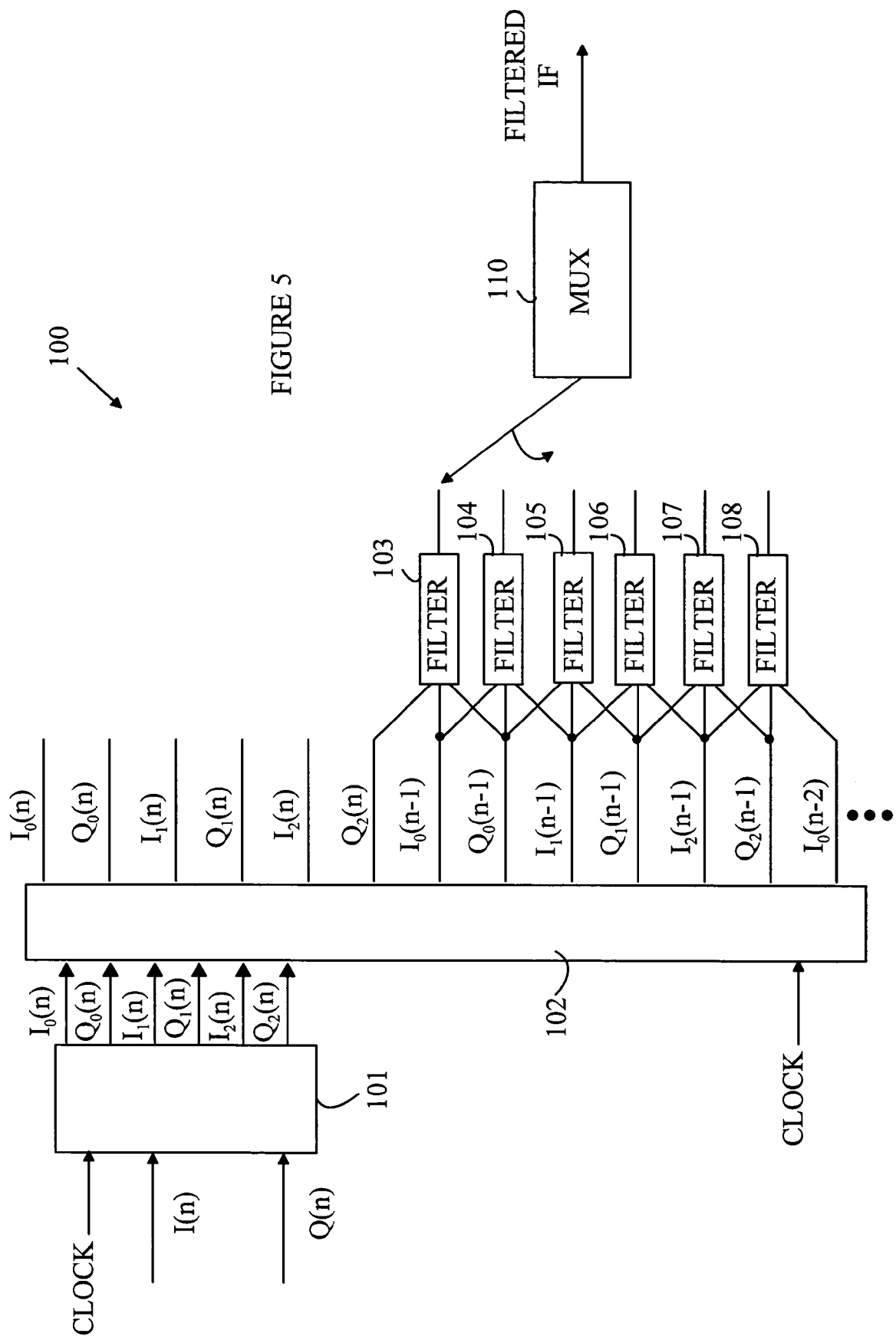
FIG. 5 is a block diagram of a modulator according to one embodiment of the present invention.

The present invention is based on the observation that any digital filtering algorithm applied to the digital IF output can be re-written as one or more filtering operations applied to the polyphase components $I_k(n)$ and $Q_k(n)$. Since filters operating on the polyphase components need to operate only at the input data rate, the problems discussed above with respect to utilizing a digital filter after the digital modulator are overcome. Refer now to FIG. 5, which is a block diagram of a modulator 100 according to one embodiment of the present invention. To simplify the following discussion, digital modulator 100 performs a 3 point interpolation, and hence, generates 6 polyphase components for each pair of I and Q inputs. In addition, the filter utilized in modulator 100 is a 3-tap finite impulse response (FIR) filter. This FIR filter is realized by applying 6 identical filters 103-108. More general embodiments will be discussed in detail below.

The input data streams, I(n) and Q(n) are converted to the polyphase components by digital modulator 101. During each input clock cycle, digital modulator 101 outputs $N_p$ polyphase components. The outputs of digital modulator 101 are loaded in a shift register 102 which holds the current polyphase components, $I_k(n)$ and $Q_k(n)$, and a number of previously generated sets or partial sets of polyphase components such as $I_k(n-1)$ and $Q_k(n-1)$, and $I_0(n-2)$ shown in FIG. 5. The number of previously generated polyphase components that must be stored depends on the number of taps in the FIR filters 103-108. The outputs of the FIR filters are sequentially read by multiplexer 110 to provide the filtered output signal.

The manner in which the present invention provides its advantages can be more easily understood by first considering the output of a conventional digital modulator that utilizes a 3-point interpolation followed by a 3-tap FIR filter. The output of the digital modulator in this case after the polyphase outputs for I(n) and Q(n) have been read-out is the sequence, $I_0(n)$, $Q_0(n)$, $I_1(n)$, $Q_1(n)$, $I_2(n)$, $Q_2(n)$, $I_0(n-1)$, $Q_0(n-1)$, $I_1(n-1)$, $Q_1(n-1)$, $I_2(n-1)$, $Q_2(n-1)$, $I_0(n-2)$, $Q_0(n-2)$, $I_1(n-2)$, $Q_1(n-2)$, $I_2(n-2)$, $Q_2(n-2)$, and so on. When this sequence is filtered by the 3-tap FIR filter, each polyphase component will be replaced by the weighted sum of that polyphase component, and the two polyphase components on each side of that component in the output sequence. For example, $I_0(n-1)$ would be replaced by $w_1Q_2(n)+w_2I_0(n-1)+w_3Q_0(n-1)$.

As noted above, a FIR filter that operates on the output of a conventional digital modulator must operate at the DAC sample rate, which is much higher than the sample rate at the input to the digital modulator. The present invention overcomes this problem by computing the filtered polyphase component values within the digital modulator using a plurality of FIR filters operating at clock rates that are much less than the DAC sample rate.

Referring again to the embodiment shown in FIG. 5, each of the FIR filters computes one of the filtered polyphase components for each input cycle. The outputs of the FIR filters are read by multiplexer 110 to provide the filtered modulated signal.

Figure 6:
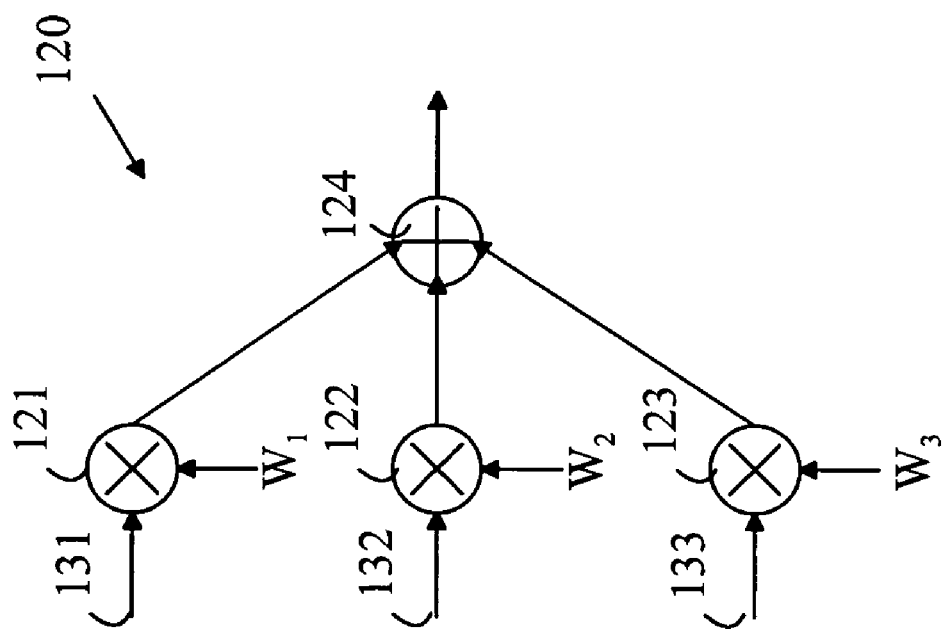
FIG. 6 illustrates one of the FIR filters shown in FIG. 5.

Refer now to FIG. 6, which illustrates one of the FIR filters 103-108 shown in FIG. 5. FIR filter 120 is connected to three cells of shift register 102 shown in FIG. 5 via inputs 131-133. Each input is connected to a multiplier that multiplies the input by a weight factor. The multipliers are shown at 121-123. The outputs of the multipliers are summed by adder 124 to provide the filtered output for the polyphase component on input 132. It should be noted that the weights in the FIR filters could be different from one another. In particular, the weights in the FIR filters that operate on the polyphase components that are the negative of the components stored in shift register 102 can be used to provide the sign change. Hence, there is no need to provide that function in the digital modulator. It should also be noted that symmetric FIR filters can be realized by adding the inputs which have the same tap weight before performing the multiplication, reducing the number of required multipliers. Also note that often the filter can be scaled such that the largest tap is unity gain, and hence, does not require a multiplier.

The above-described embodiment of the present invention utilized a 3-tap filter, and hence, required only one polyphase component from the previous and following sets of polyphase components. The filtered components computed in this embodiment from the previously generated set of polyphase components augmented by one component from the current set, i.e., $Q_2(n)$, and one polyphase component from the set computed two cycles earlier, i.e., $I_0(n-2)$. Hence, the shift register only needs to store 8 polyphase components.

In general, the number of polyphase components that must be stored depends on the number of taps in the filters. Define a cycle to be the generation of the polyphase components corresponding to one set of input I and Q values. At the beginning of the $n^{th}$ cycle, I(n) and Q(n) are received by digital modulator 101. Digital modulator 101 then computes the polyphase components $I_k(n)$ and $Q_k(n)$. At the end of the $n^{th}$ cycle, the contents of shift register 102 are shifted down $N_p$ places, where $N_p$ is the number of polyphase components that are generated during the $n^{th}$ cycle. In the example shown in FIGS. 5 and 6, $N_p$ is 6.

During the $(n+1)^{th}$ cycle, the filtered polyphase components corresponding to an earlier cycle are computed. At this point, the polyphase components for the $n^{th}$ cycle, $(n-1)^{th}$ cycle, and at least part of the (n-2) cycle are stored in shift register 102. The identity of the earlier cycle and the number of stored polyphase components depends on the number of taps in the filters, $N_t$, and $N_p$. If $N_t$ is less than $2N_p$, the filters can be connected to the shift register cells that store the prior set of polyphase components in the manner shown in FIG. 5. That is, the filtered polyphase components that are computed during the $n^{th}$ cycle are those corresponding to inputs I(n-1), and Q(n-1).

If, on the other hand, the number of taps is larger than twice the number of polyphase components, at least one of the filters will require a polyphase component that is to be computed in the $(n+1)^{th}$ cycle, and hence, will not be available. In addition, at least one of the filters will require a polyphase component from the $(n-2)^{th}$ cycle, and hence, shift register 102 would need to store the polyphase components from four cycles. In this case, the filters will need to be connected to the shift register cells that store the polyphase components from the $(n-2)^{th}$ cycle or an earlier cycle rather than those corresponding to the $(n-1)^{th}$ cycle as shown in FIG. 5. For the purposes of this discussion, assume that $N_t$, and $N_p$ are chosen such that the shift register cells at which the $(n-2)^{th}$ cycle polyphase components are stored are connected to the filters. The filtered polyphase components generated at the $n^{th}$ cycle would then be those corresponding to the polyphase components that were generated at the $(n-2)^{th}$ cycle, and there will be a two cycle delay in the generation of the polyphase components.

The above-described embodiments of the present invention utilize linear FIR filters to filter the digitally modulated signal. However, any form of digital filter can be utilized. In general, each filter can compute an arbitrary function of the polyphase components connected thereto. For example, the filters can compute a filtered output that includes the weighted sums of products of various polyphase components.

Furthermore, any of the filters can be connected to polyphase components from more than one cycle. If a filter requires a component from a previous cycle that is not stored in shift register 102, the filter can also include a register or other form of memory for storing previously generated polyphase phase components.

The above-described embodiments of the present invention utilized $N_p$ individual filters, one for each polyphase component supplied by the digital modulator. This arrangement reduces the computational workload of each filter by a factor of $N_p$. If the filters require more time, embodiments in which more filters are utilized can also be constructed.

Figure 7:
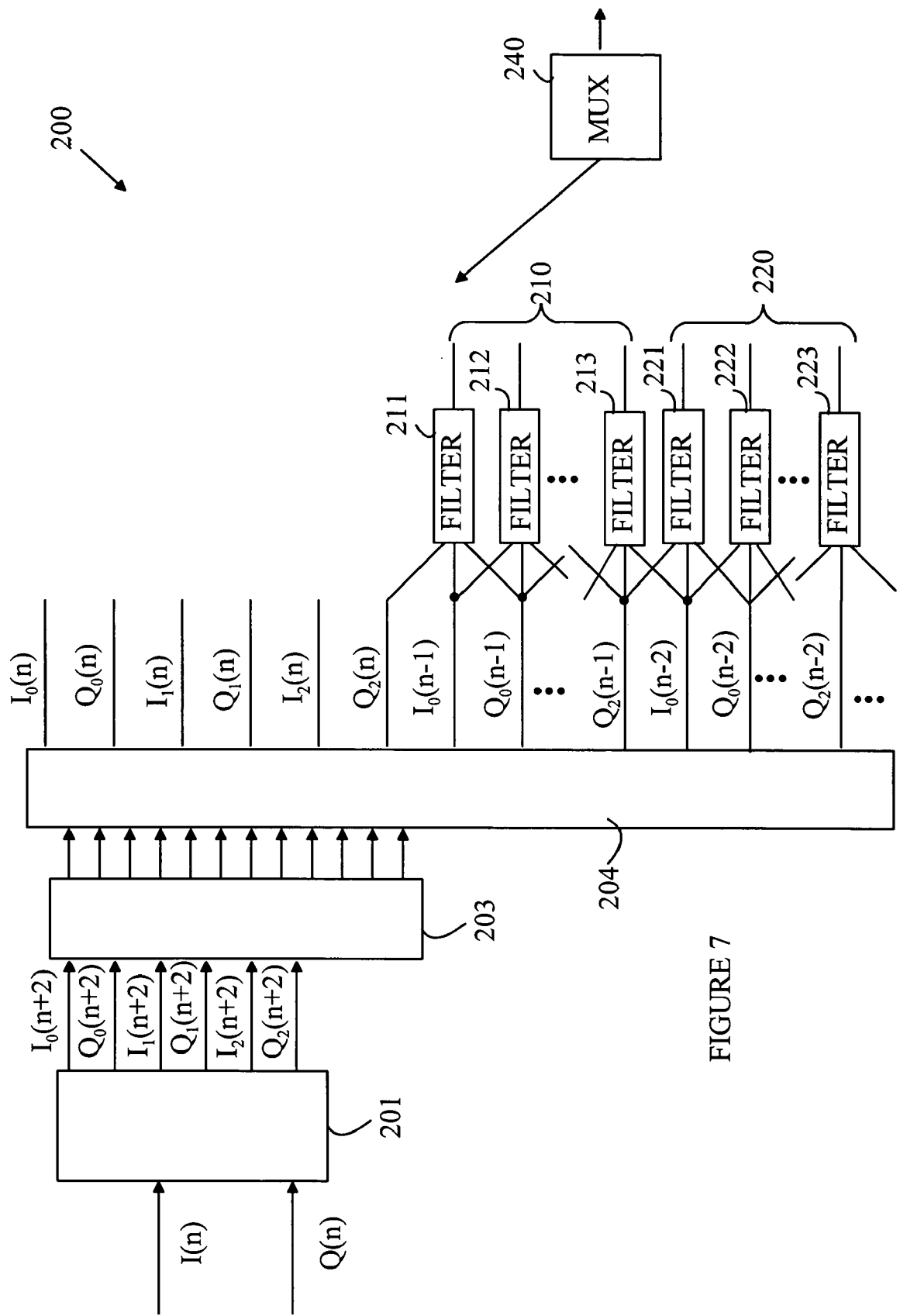
FIG. 7 is a block diagram of a modulator according to another embodiment of the present invention.

Refer now to FIG. 7, which is a block diagram of a modulator 200 according to another embodiment of the present invention. Modulator 200 utilizes a digital modulator 201 to generate 6 polyphase components on each cycle. To simplify the following discussion, it will be assumed that the 6 polyphase components generated on each cycle and the filter to be applied to the IF signal is again a 3-tap FIR filter. In addition, the polyphase outputs of digital modulator 201 are stored in a first shift register 203. In every other cycle, the contents of shift register 204 are shifted down 12 locations and the 12 polyphase components generated in the previous two cycles and stored in shift register 203 are moved to the first 12 locations in shift register 204.

Modulator 200 utilizes two banks of FIR filters to further reduce the computational load on each filter. The first bank of filters includes 6 filters as shown at 210. Exemplary filters are shown at 211-213. For the purposes of this discussion, it will be assumed that this filter bank operates on the polyphase components generated on the odd cycles. The second bank of filters 220 also includes 6 filters. Exemplary filters from this bank are shown at 221-223. Since filter bank 210 operates on the polyphase components generated on the odd cycles, filter bank 220 operates on the polyphase components generated on the even cycles. Since each filter now has two cycles in which to complete its computations, the filters can operate at half the input clock rate. Multiplexer 240, however, must operate at the output clock rate.

The embodiment shown in FIG. 7 utilizes two shift registers. However, the first shift register can be any form of storage register or memory that stores the polyphase components generated on either the even or odd cycles. If shift register 204 shifts on the even cycles, then this memory must store the polyphase components generated on the odd cycles. In this case, the polyphase components generated on the even cycles can be transferred directly into shift register 204 after shift register 204 has completed its 12-position shift.

If the filter design permits the filter computations to be carried out in a time frame less than half of an input cycle, two or more of the filters can be replaced by a data processor that simulates a plurality of filters. Such embodiments are useful in the case in which the filter computation requires less than $T/2$ but more than $T/N_p$, where $1/T$ is the input frequency to digital modulator 201 and $N_p$ is the number of polyphase components that are generated by digital modulator 201 for each input cycle.

Various modifications to the present invention will become apparent to those skilled in the art from the foregoing description and accompanying drawings. Accordingly, the present invention is to be limited solely by the scope of the following claims.

What is claimed is:

1. An upconverting circuit comprising:
    a clock for defining a sequence of input polyphase cycles;
    a polyphase component generator that provides $2N_p$ polyphase components from an input signal having an in-phase and a quadrature signal at each input polyphase cycle, wherein $N_p>2$, there being $N_p$ polyphase components corresponding said in-phase signal and $N_p$ polyphase components corresponding to said quadrature signal;
    a memory that stores said polyphase components from at least one polyphase cycle prior to the current polyphase cycle;
    a plurality of filters, each filter processing a plurality of said polyphase components stored in said memory to generate a filtered polyphase component corresponding to that filter, wherein in any given input polyphase cycle, at least one of said filters processes a plurality of different polyphase components stored in said memory from a corresponding polyphase cycle; and
    a multiplexer that outputs said filtered polyphase components in a predetermined order to generate a filtered output signal comprising an upconverted version of said input signal.

2. The upconverting circuit of claim 1 wherein each filter utilizes the same functional relationship to generate said filtered polyphase components.

3. The upconverting circuit of claim 1 wherein said filters are finite impulse response filters.

4. The upconverting circuit of claim 1 wherein said polyphase component generator receives one pair of digital signals in each polyphase cycle.

5. An upconverting circuit comprising:
    a clock for defining a sequence of input polyphase cycles;
    a polyphase component generator that provides $N_p$ polyphase components at each input polyphase cycle, wherein $N_p>2$;
    a memory that stores said polyphase components from at least one polyphase cycle prior to the current polyphase cycle;
    a plurality of filters, each filter processing a plurality of said polyphase components stored in said memory to generate a filtered polyphase component corresponding to that filter; and
    a multiplexer that outputs said filtered polyphase components in a predetermined order to generate a filtered output signal;
    wherein said memory comprises a shift register.

6. An upconverting circuit comprising:
    a clock for defining a sequence of input polyphase cycles;
    a polyphase component generator that provides $N_p$ polyphase components at each input polyphase cycle, wherein $N_p>2$;
    a memory that stores said polyphase components from at least one polyphase cycle prior to the current polyphase cycle;
    a plurality of filters, each filter processing a plurality of said polyphase components stored in said memory to generate a filtered polyphase component corresponding to that filter; and
    a multiplexer that outputs said filtered polyphase components in a predetermined order to generate a filtered output signal;
    wherein said filter generate a filtered polyphase component that depends on a non-linear combination of said polyphase component.

* * * * *

UNITED STATES PATENT AND TRADEMARK OFFICE
CERTIFICATE OF CORRECTION

PATENT NO.        : 7,450,659 B2
APPLICATION NO.   : 10/814472
DATED             : November 11, 2008
INVENTOR(S)       : Corredoura et al.

It is certified that error appears in the above-identified patent and that said Letters Patent is hereby corrected as shown below:

On the title page, item (75), in "Inventors", in column 1, line 2, delete "Sunnyvale," and insert -- Fremont, --, therefor.

In column 6, line 60, in Claim 6, delete "filter" and insert -- filters --, therefor.

In column 6, line 62, in Claim 6, delete "component." and insert -- components. --, therefor.

Signed and Sealed this

Twenty-fourth Day of March, 2009

JOHN DOLL
*Acting Director of the United States Patent and Trademark Office*